(12) United States Patent
Ono et al.

(10) Patent No.: US 11,799,446 B2
(45) Date of Patent: Oct. 24, 2023

(54) RESONATOR, AND FILTER AND DUPLEXER USING THE SAME

(71) Applicant: WISOL CO., LTD., Osan-si (KR)

(72) Inventors: Satoru Ono, Osan-si (KR); Won Ju Yang, Osan-si (KR)

(73) Assignee: WISOL CO., LTD, Osan-si (KR)

( * ) Notice: Subject to any disclaimer, the term of this patent is extended or adjusted under 35 U.S.C. 154(b) by 636 days.

(21) Appl. No.: 17/076,205

(22) Filed: Oct. 21, 2020

(65) Prior Publication Data

US 2021/0126613 A1    Apr. 29, 2021

(30) Foreign Application Priority Data

Oct. 25, 2019 (KR) .......... 10-2019-0133487

(51) Int. Cl.
*H03H 9/145* (2006.01)
*H03H 9/25* (2006.01)
*H03H 9/72* (2006.01)
*H03H 9/64* (2006.01)

(52) U.S. Cl.
CPC .......... *H03H 9/14544* (2013.01); *H03H 9/25* (2013.01); *H03H 9/64* (2013.01); *H03H 9/725* (2013.01)

(58) Field of Classification Search
CPC ........ H03H 9/14544; H03H 9/25; H03H 9/64; H03H 9/725; H03H 9/6413; H03H 9/02818; H03H 9/6489
See application file for complete search history.

(56) References Cited

U.S. PATENT DOCUMENTS 11,070,195 B2 * 7/2021 Uesaka .............. H03H 9/14582

FOREIGN PATENT DOCUMENTS

KR    10-2017-0111269 A    10/2017

* cited by examiner

*Primary Examiner* — Emily P Pham
(74) *Attorney, Agent, or Firm* — LRK PATENT LAW FIRM

(57) ABSTRACT

A resonator includes an interdigital transducer provided with a main electrode area formed to a shape of a comb on a piezoelectric substrate by a reference pitch in such a manner as to have a unit length along a longitudinal direction thereof and one pair of first electrode areas constituted of one side first electrode area formed to a shape of a comb on the piezoelectric substrate by a first increment pitch obtained by increasing the reference pitch by a first value in such a manner as to have the unit length along the longitudinal direction and the other side first electrode area formed to a shape of a comb on the piezoelectric substrate by a first decrement pitch obtained by decreasing the reference pitch by almost the same value as the first value.

13 Claims, 20 Drawing Sheets

|  | area 1 | area 2 | area 3 |
|---|---|---|---|
| conventional practice | reference pitch | reference pitch | reference pitch |
| embodiment 1 | first decrement pitch | reference pitch | first increment pitch |
| embodiment 2 | first increment pitch | reference pitch | first decrement pitch |
| embodiment 3 | reference pitch | first increment pitch | first decrement pitch |
| embodiment 4 | reference pitch | first decrement pitch | first increment pitch |
| embodiment 5 | first decrement pitch | first increment pitch | reference pitch |
| embodiment 6 | first increment pitch | first decrement pitch | reference pitch |

FIG. 5

RESONATOR, AND FILTER AND DUPLEXER USING THE SAME

CROSS REFERENCE TO RELATED APPLICATION

The present application claims the benefit of Korean Patent Application No. 10-2019-0133487 filed in the Korean Intellectual Property Office on Oct. 25, 2019, the entire contents of which are incorporated herein by reference.

BACKGROUND OF THE INVENTION

1. Field of the Invention

The present invention relates to a surface acoustic wave (hereinafter referred to as "SAW") resonator, and a filter and a duplexer using the same.

2. Description of Related Art

Generally, a series resonator located between signal lines and a parallel resonator located between a signal line and ground are used as resonators (SAW resonators).

FIG. 1 is a graph showing the comparison between the characteristics of a real part of a parallel resonator and the characteristics of a SAW device (filter) having the parallel resonator in a conventional practice (which is disclosed in Korean Patent Application Laid-open No. 10-2017-0111269 (Oct. 12, 2017). As shown in FIG. 1, a transverse axis indicates a frequency MHz, a right longitudinal axis the characteristics of a real part of a parallel resonator, and a left longitudinal axis the characteristics of a SAW device (filter) having the parallel resonator.

As shown in FIG. 1, a response B occurring in a frequency band (specific frequency band) over an anti-resonance point is degraded in the characteristics A of the parallel resonator in the conventional practice. In the SAW device having the parallel resonator, especially, in a device like a wide-band filter and duplexer, a passband overlaps in the specific frequency band, thereby undesirably causing an insertion loss C to be degraded in the specific frequency band of the device.

SUMMARY OF THE INVENTION

Accordingly, the present invention has been made in view of the above-mentioned problems occurring in the related art, and it is an object of the present invention to provide a resonator (SAW resonator) that is capable of being improved in performance.

To accomplish the above-mentioned object, according to the present invention, there is provided a resonator including an interdigital transducer provided with a main electrode area formed to a shape of a comb on a piezoelectric substrate by means of a reference pitch in such a manner as to have a unit length along a longitudinal direction thereof and one pair of first electrode areas constituted of one side first electrode area formed to a shape of a comb on the piezoelectric substrate by means of a first increment pitch obtained by increasing the reference pitch by a first value in such a manner as to have the unit length along the longitudinal direction and the other side first electrode area formed to a shape of a comb on the piezoelectric substrate by means of a first decrement pitch obtained by decreasing the reference pitch by almost the same value as the first value.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 5 is a table showing examples of pitches applicable to an interdigital transducer (IDT) of the parallel resonator used in the SAW device of FIG. 2;

DETAILED DESCRIPTION OF THE EMBODIMENTS

Figure 1:
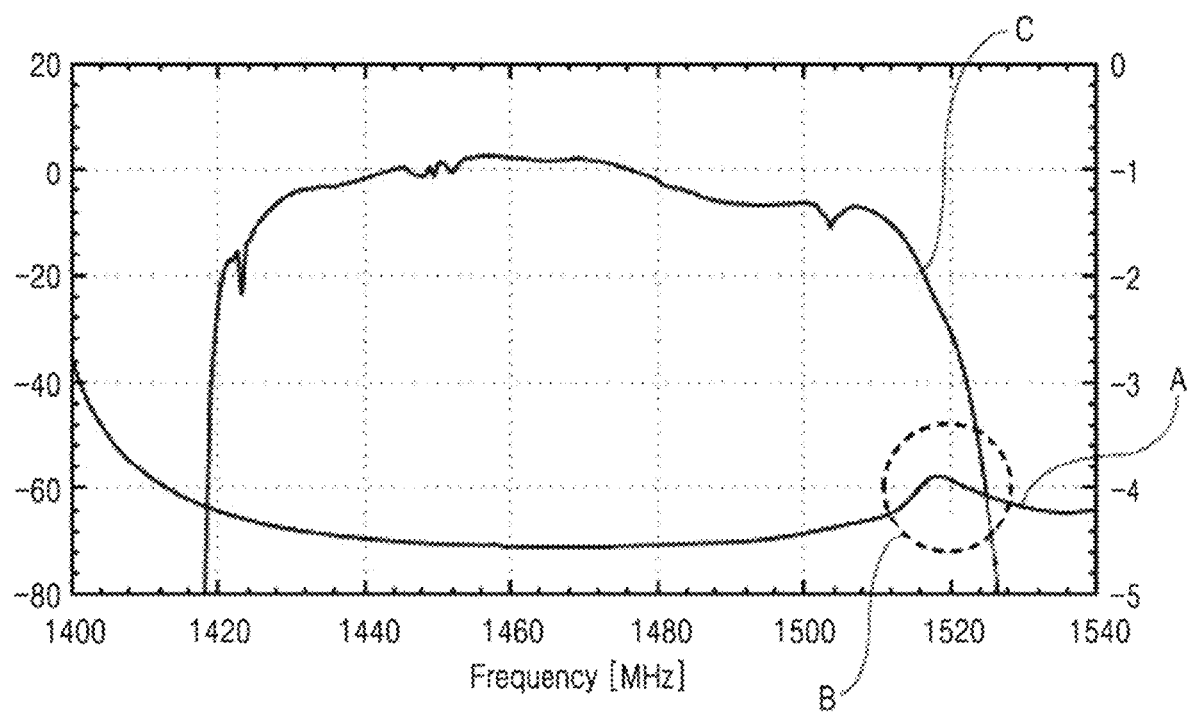
FIG. 1 is a graph showing the comparison between the characteristics of a real part of a parallel resonator and the characteristics of a SAW device (filter) having the parallel resonator in a conventional practice.

Hereinafter, various embodiments of the present invention will be explained with reference to the attached drawings. Moreover, the present invention is disclosed with reference to the attached drawings wherein the corresponding parts in the embodiments of the present invention are indicated by corresponding reference numerals. For the convenience of the description, also, it should be noted that the parts illustrated in any drawing will be not shown in other drawings. Furthermore, it should be noted that the attached drawings are not provided with accurate scales.

All terms used herein, including technical or scientific terms, unless otherwise defined, have the same meanings which are typically understood by those having ordinary skill in the art. The terms, such as ones defined in common dictionaries, should be interpreted as having the same meanings as terms in the context of pertinent technology, and should not be interpreted as having ideal or excessively formal meanings unless clearly defined in the specification. Terms used in this application are used to only describe specific exemplary embodiments and are not intended to restrict the present invention. An expression referencing a singular value additionally refers to a corresponding expression of the plural number, unless explicitly limited otherwise by the context.

In this application, terms, such as "comprise", "include", or 'have", are intended to designate those characteristics, numbers, steps, operations, elements, or parts which are described in the specification, or any combination of them that exist.

1. Configuration of a SAW Device Having Resonators According to the Present Invention FIG. 2 is a diagram showing a SAW device (filter) 1 having resonators according to the present invention.

Figure 2:
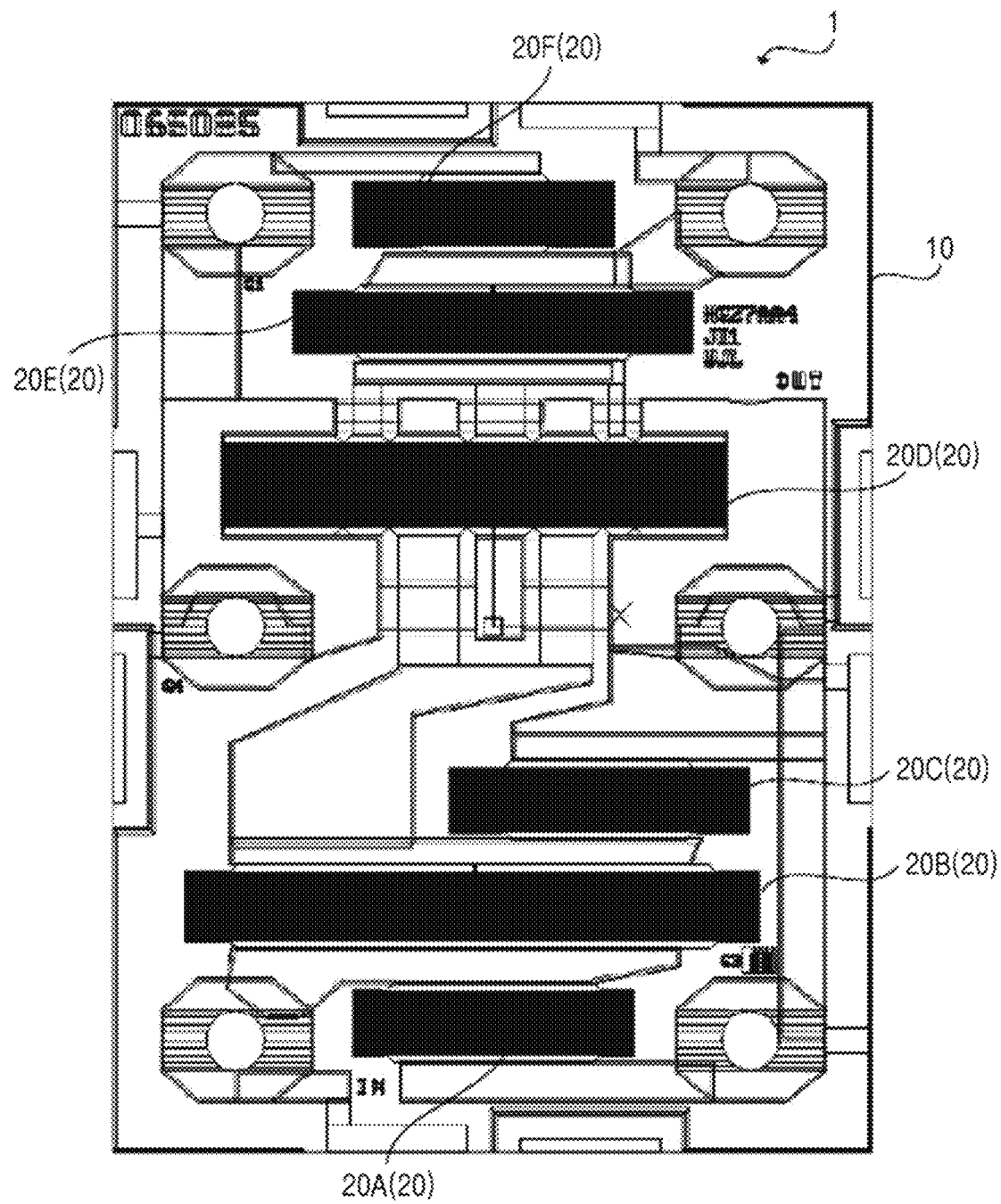
FIG. 2 is a diagram showing a SAW device (filter) having resonators according to the present invention.

As shown in FIG. 2, the SAW device 1 according to the present invention includes at least one or more resonators 20 located on a piezoelectric substrate 10. In detail, the SAW device 1 includes, for example, six resonators 20A to 20F. The resonators 20 include series resonators located between signal lines and/or parallel resonators located between a signal line and ground. As shown in FIG. 2, for example, the resonator 20A is a parallel resonator located between a signal line and ground, and the resonator 20B is a series resonator located between signal lines.

In FIG. 2, further, the SAW device 1 is, for example, a filter (band pass filter), but it may be a duplexer.

2. Configuration of the Resonator 20

One example of the parallel resonator located between a signal line and ground will be explained with reference to FIG. 3.

Figure 3:
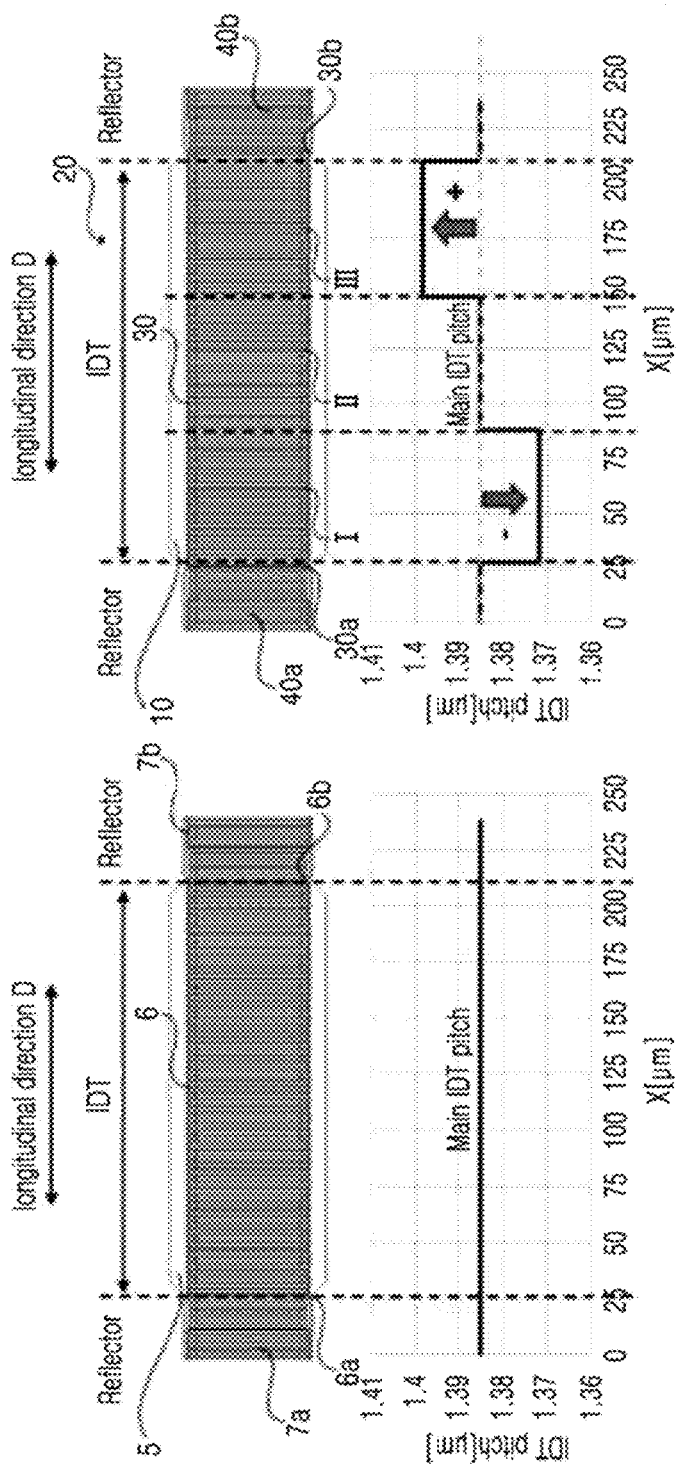
FIG. 3 is a diagram showing the comparison between the parallel resonator used in the SAW device of FIG. 2 and the parallel resonator used in the conventional practice.

FIG. 3 is a diagram showing the comparison between the parallel resonator used in the SAW device 1 of FIG. 2 and the parallel resonator used in the conventional practice.

Top of the parallel resonator in the conventional practice is shown on an upper left side of FIG. 3, and pitches of an interdigital transducer (hereinafter referred to as "IDT") contained in the parallel resonator are shown on a lower left side of FIG. 3. Further, top of the parallel resonator according to the present invention is shown on an upper right side of FIG. 3, and pitches of the IDT contained in the parallel resonator are shown on a lower right side of FIG. 3.

As shown on the upper left side of FIG. 3, first, the parallel resonator in the conventional practice includes one IDT 6 located on a piezoelectric substrate 5 in such a manner as to be extended in a longitudinal direction D, one reflector 7a spaced apart from one end 6a of the IDT 6 on the piezoelectric substrate 5 in such a manner as to face one end 6a of the IDT 6, and one reflector 7b spaced apart from the other end 6b of the IDT 6 on the piezoelectric substrate 5 in such a manner as to face the other end 6b of the IDT 6. As shown on the lower left side of FIG. 3, the pitches of the IDT 6 are constant (1.385 u m) along the longitudinal direction D.

On the other hand, the parallel resonator 20 according to the present invention includes one IDT 30 located on the piezoelectric substrate 10 in such a manner as to be extended in a longitudinal direction D to thus constitute a comb-shaped electrode, one reflector 40a spaced apart from one end 30a of the IDT 30 on the piezoelectric substrate 10 in such a manner as to face one end 30a of the IDT 30, and one reflector 40b spaced apart from the other end 30b of the IDT 30 on the piezoelectric substrate 10 in such a manner as to face the other end 30b of the IDT 30.

According to the present invention, as shown on the upper right side of FIG. 3, three areas I, II and III are provided along the longitudinal direction D. The areas I, II and III constitute the comb-shaped electrode. The area I includes one end 30a of the IDT 30, the area III the other end 30b of the IDT 30, and the area II is located between the area I and the area III. The areas I, II and III have unit lengths along the longitudinal direction D. In this case, the unit lengths are obtained by dividing a length from one end 30a of the IDT 30 to the other end 30b of the IDT 30 in the longitudinal direction D into three equal portions.

As shown on the lower right side of FIG. 3, the area II is one electrode area (main electrode area) that is formed to a shape of a comb by means of a reference pitch (for example, about 1.385 u m) and has the unit length along the longitudinal direction D. The reference pitch of the area II is constant (for example, about 1.385 u m) along the longitudinal direction D.

The area III is one electrode area (one side first electrode area) that is formed to a shape of a comb by means of a first increment pitch obtained by increasing the reference pitch by a first value (for example, about 0.013 u m) and has the unit length along the longitudinal direction D. The first increment pitch of the area III is constant (for example, about 1.398 u m) along the longitudinal direction D.

The area I is one electrode area (the other side first electrode area) that is formed to a shape of a comb by means of a first decrement pitch obtained by decreasing the reference pitch by almost the same value as the first value (for example, about 0.013 u m) and has the unit length along the longitudinal direction D. The first decrement pitch of the area I is constant (for example, about 1.372 u m) along the longitudinal direction D.

Instead of the IDT having the constant pitches along the longitudinal direction D from one end thereof to the other end thereof, the parallel resonator according to the present invention makes use of the IDT 30 having the main electrode area (the area II) having the reference pitch and one pair of first electrode areas constituted of one side first electrode area (the area III) having the first increment pitch obtained by increasing the reference pitch by the first value and the other side first electrode area (the area I) having the first decrement pitch obtained by decreasing the reference pitch by almost the same value as the first value.

Figure 4A:
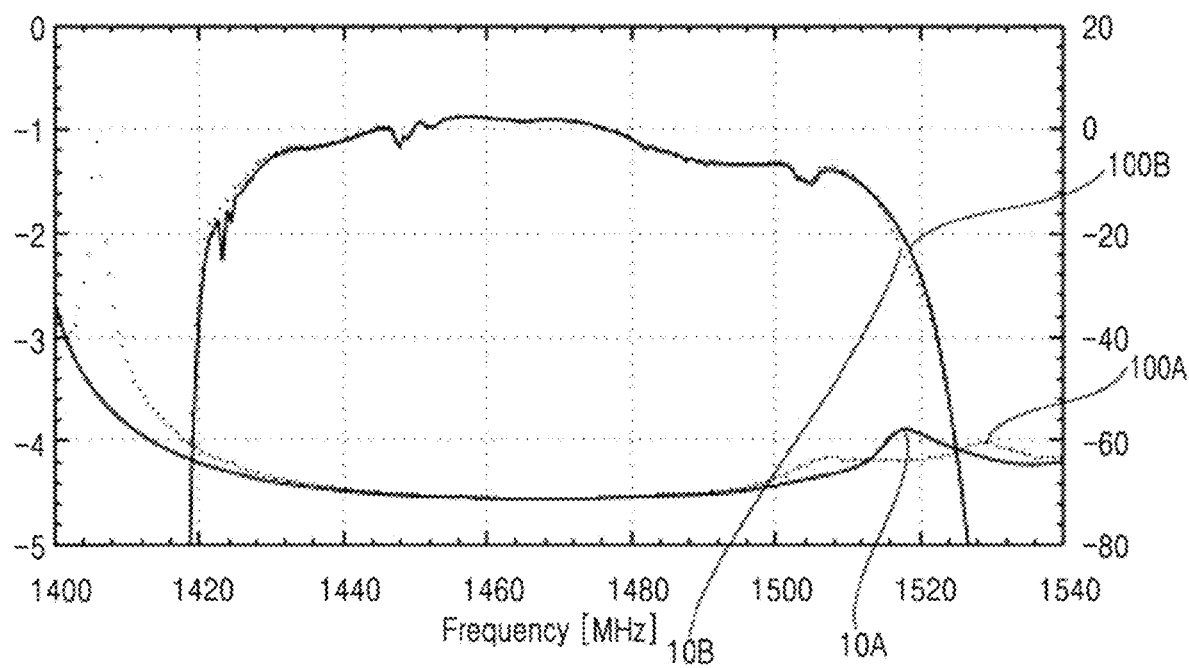
FIG. 4A is a graph showing the comparison between the characteristics of a real part of the parallel resonator of FIG. 3 and the characteristics of the SAW device (filter) having the parallel resonator.
Figure 4B:
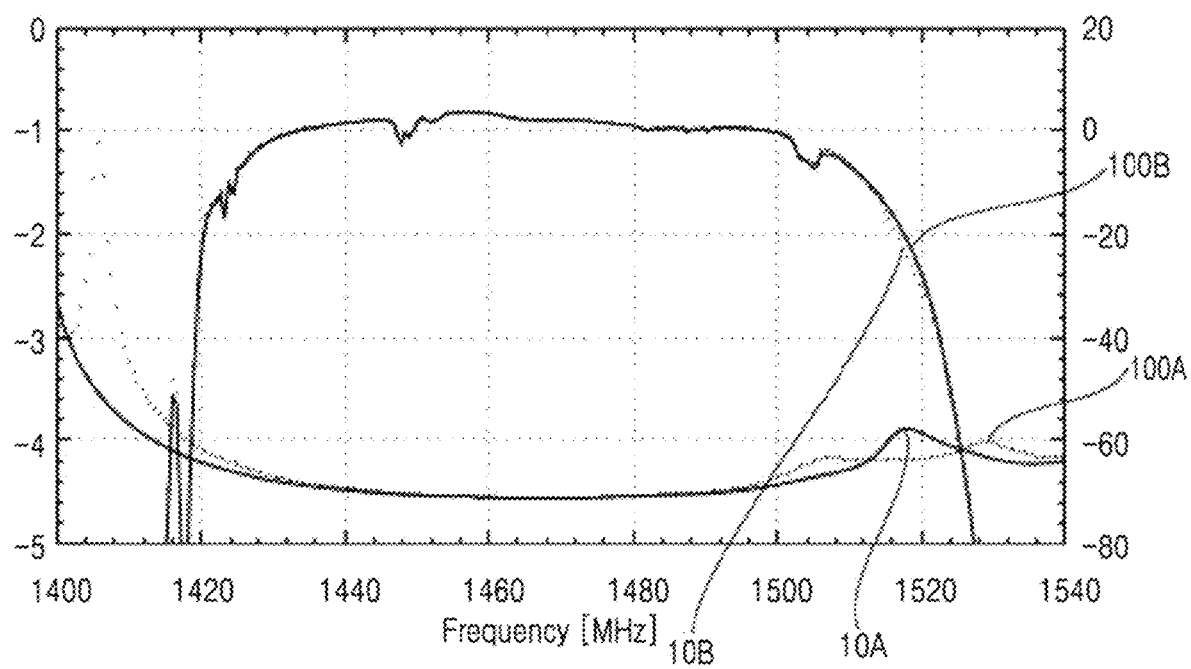
FIG. 4B is a graph showing the comparison between the characteristics of the real part of the parallel resonator of FIG. 3 and the characteristics (after mismatch losses are reduced) of the SAW device (filter) having the parallel resonator.

Now, an explanation on effects obtained by the introduction of the IDT 30 having the above-mentioned configuration will be given with reference to FIGS. 4A and 4B. First, FIG. 4A is a graph showing the comparison between the characteristics of the real part of the parallel resonator of FIG. 3 and the characteristics of the SAW device (filter) having the parallel resonator. FIG. 4B is a graph showing the comparison between the characteristics of the real part of the parallel resonator of FIG. 3 and the characteristics (after mismatch losses are reduced) of the SAW device (filter) having the parallel resonator.

Losses in the SAW filter include a first loss caused by simple resistances of electrodes and wires, a second loss caused by the leakage of the entire SAW energy put in the resonator, and a third loss caused by a difference in impedance matching, and excepting the third loss, the first and second losses (in which it is assumed that an impedance is 50Ω in every frequency band) are defined as mismatch losses.

In FIGS. 4A and 4B, a transverse axis indicates a frequency MHz, a left longitudinal axis the characteristics dB of a real part of the parallel resonator 20, and a right longitudinal axis the characteristics dB of the SAW device having the parallel resonator 20.

As shown in FIGS. 4A and 4B, a frequency band 100A wherein a degradation response is generated in the characteristics (which are indicated by a dotted line) of the real part of the parallel resonator 20 according to the present invention is shifted to a higher frequency band than a frequency band 10A wherein a degradation response is generated in the characteristics (which are indicated by a solid line) of the real part of the parallel resonator in the conventional practice. In the characteristics of the real part of the parallel resonator 20 according to the present invention, it is possible to (at least partially) suppress the occurrence of degradation in the frequency band 10A wherein the degradation response is generated in the characteristics of the real part of the parallel resonator in the conventional practice.

In this case, the frequency band 100A wherein the degradation response is generated in the characteristics of the real part of the parallel resonator 20 according to the present invention is higher than a passband of the SAW device (filter) 1 having the parallel resonator 20. In detail, the frequency band 100A is an attenuation band of the SAW device 1. Accordingly, an insertion loss 100B in the characteristics (which are indicated by a solid line) of the SAW device 1 having the parallel resonator 20 can be more suppressed than an insertion loss 10B in the characteristics (which are indicated by a dotted line) of the SAW device having the parallel resonator in the conventional practice.

The pitches used in the respective areas as shown in FIG. 3 are just examples. Detailed methods for selecting the pitches will be explained with reference to FIG. 5. FIG. 5 is a table showing examples of pitches applicable to an IDT of the parallel resonator 20 used in the SAW device 1 of FIG. 2.

First, one area of the three areas I, II and III is the main electrode area. One side area of the remaining two areas is one side first electrode area, and the other side area is the other side first electrode area. Accordingly, one side first electrode area and the other side first electrode area constitute one pair of first electrode areas.

The main electrode area has the reference pitch. One side first electrode area has the first increment pitch obtained by increasing the reference pitch by the first value, and the other side first electrode area has the first decrement pitch obtained by decreasing the reference pitch by almost the same value as the first value.

Under the above-mentioned rules, accordingly, six embodiments as shown in FIG. 5 can be made.

In a first embodiment of the present invention, as shown in FIG. 3, the area II becomes the main electrode area having the reference pitch, the area III one side first electrode area having the first increment pitch, and the area I the other side first electrode area having the first decrement pitch.

In a second embodiment of the present invention, the area II becomes the main electrode area having the reference pitch, the area I one side first electrode area having the first increment pitch, and the area III the other side first electrode area having the first decrement pitch.

In a third embodiment of the present invention, the area I becomes the main electrode area having the reference pitch, the area II one side first electrode area having the first increment pitch, and the area III the other side first electrode area having the first decrement pitch.

In a fourth embodiment of the present invention, the area I becomes the main electrode area having the reference pitch, the area III one side first electrode area having the first increment pitch, and the area II the other side first electrode area having the first decrement pitch.

In a fifth embodiment of the present invention, the area III becomes the main electrode area having the reference pitch, the area II one side first electrode area having the first increment pitch, and the area I the other side first electrode area having the first decrement pitch.

In a sixth embodiment of the present invention, the area III becomes the main electrode area having the reference pitch, the area I one side first electrode area having the first increment pitch, and the area II the other side first electrode area having the first decrement pitch.

Even in case where any one of the second to sixth embodiments of the present invention is carried out, as mentioned in the first embodiment of the present invention (with reference to FIG. 3), a frequency band wherein a degradation response is generated in the characteristics of the real part of the parallel resonator is shifted to a higher frequency band than a frequency band wherein a degradation response is generated in the characteristics of the real part of the parallel resonator in the conventional practice. In the characteristics of the real parts of the respective parallel resonators 20 according to the second to sixth embodiments of the present invention, accordingly, it is possible to (at least partially) suppress the occurrence of degradation in the frequency band 10A wherein the degradation response is generated in the characteristics of the real part of the parallel resonator in the conventional practice.

As a result, an insertion loss in the characteristics of the SAW device 1 having the parallel resonator 20 according to the embodiments of the present invention can be more suppressed than that in the characteristics of the SAW device having the parallel resonator in the conventional practice. Now, an explanation on such effects according to the present invention will be given with reference to FIGS. 6A to 11B.

Figure 6A:
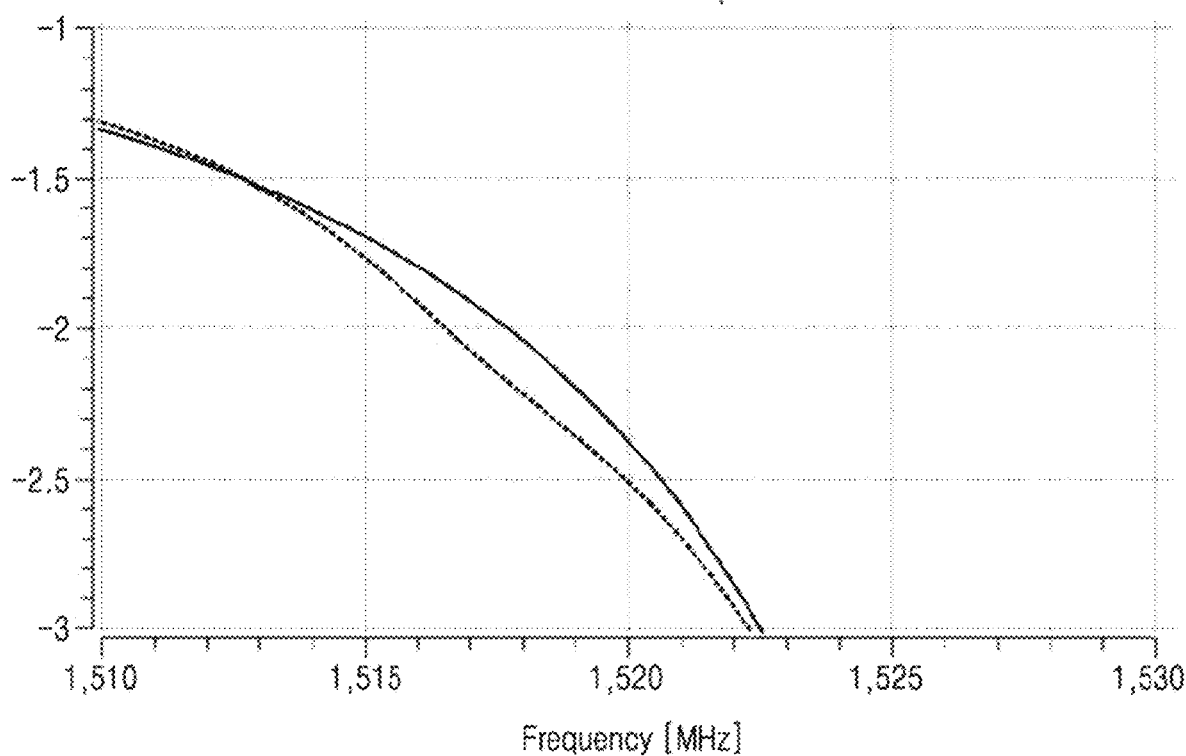
FIG. 6A is a graph showing the comparison between the characteristics of the SAW device having the parallel resonator according to a first embodiment of the present invention as mentioned in FIG. 5 and the characteristics of the SAW device having the parallel resonator in the conventional practice.
Figure 6B:
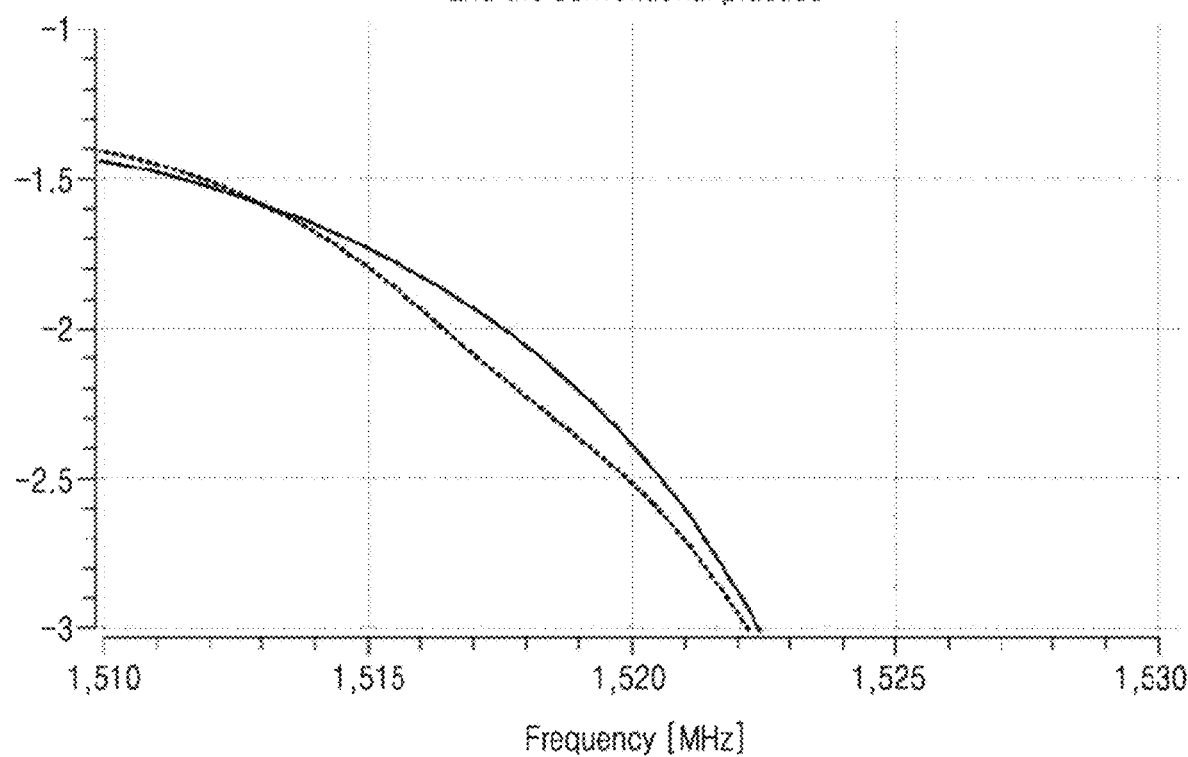
FIG. 6B is a graph showing the comparison between the characteristics of the SAW device having the parallel resonator according to the first embodiment of the present invention as mentioned in FIG. 5 and the characteristics (after mismatch losses are reduced) of the SAW device having the parallel resonator in the conventional practice.

FIG. 6A is a graph showing the comparison between the characteristics of the SAW device having the parallel resonator according to the first embodiment of the present invention as mentioned in FIG. 5 and the characteristics of the SAW device having the parallel resonator in the conventional practice. FIG. 6B is a graph showing the comparison between the characteristics of the SAW device having the parallel resonator according to the first embodiment of the present invention as mentioned in FIG. 5 and the characteristics (after mismatch losses are reduced) of the SAW device having the parallel resonator in the conventional practice.

Figure 7A:
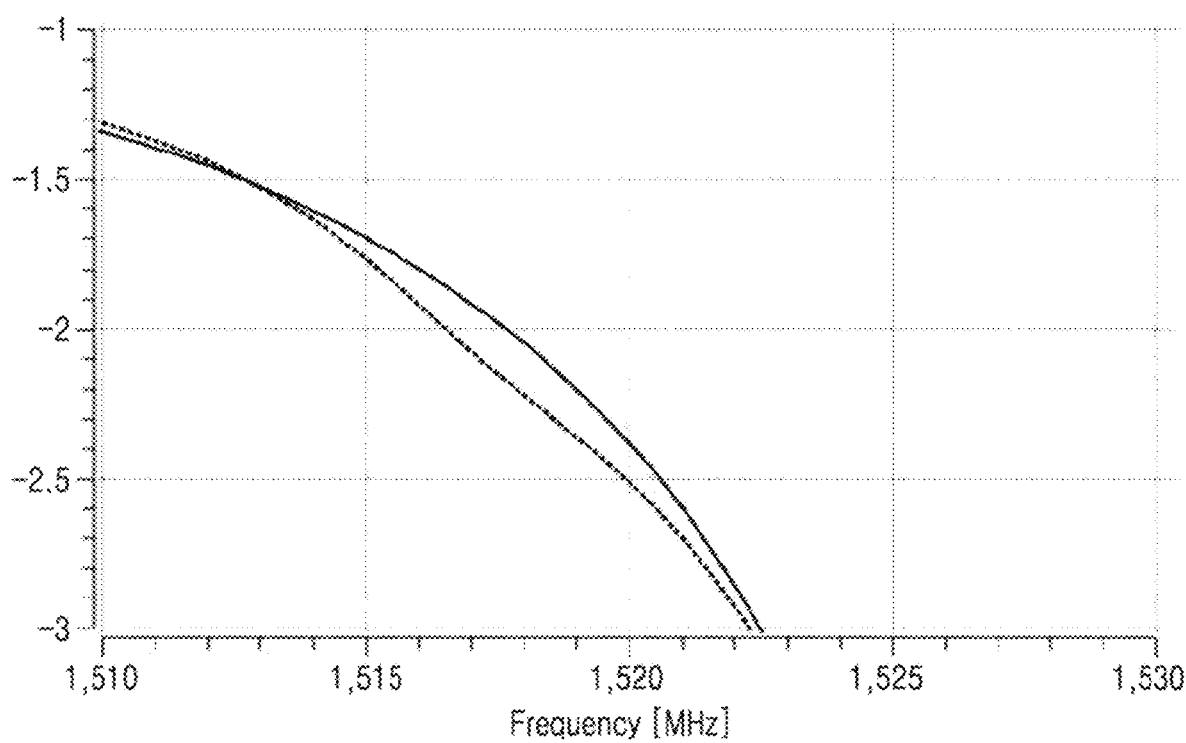
FIG. 7A is a graph showing the comparison between the characteristics of the SAW device having the parallel resonator according to a second embodiment of the present invention as mentioned in FIG. 5 and the characteristics of the SAW device having the parallel resonator in the conventional practice.
Figure 7B:
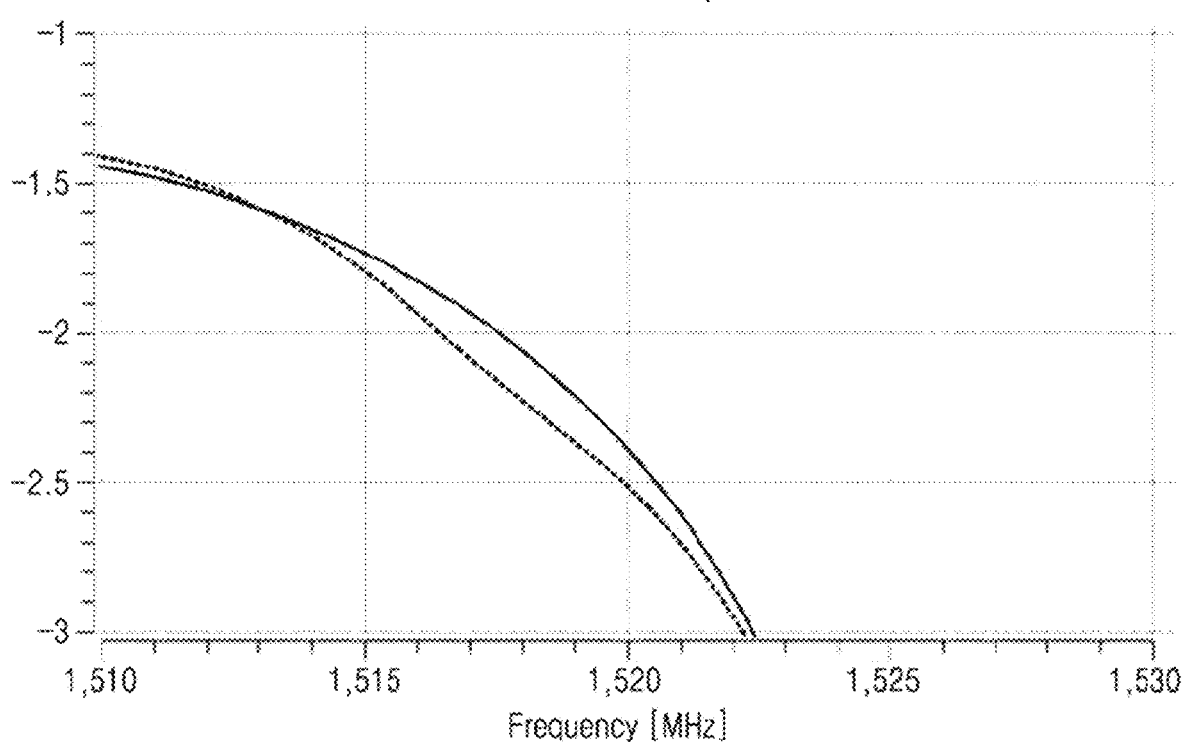
FIG. 7B is a graph showing the comparison between the characteristics of the SAW device having the parallel resonator according to the second embodiment of the present invention as mentioned in FIG. 5 and the characteristics (after mismatch losses are reduced) of the SAW device having the parallel resonator in the conventional practice.

FIG. 7A is a graph showing the comparison between the characteristics of the SAW device having the parallel resonator according to the second embodiment of the present invention as mentioned in FIG. 5 and the characteristics of the SAW device having the parallel resonator in the conventional practice. FIG. 7B is a graph showing the comparison between the characteristics of the SAW device having the parallel resonator according to the second embodiment of the present invention as mentioned in FIG. 5 and the characteristics (after mismatch losses are reduced) of the SAW device having the parallel resonator in the conventional practice.

Figure 8A:
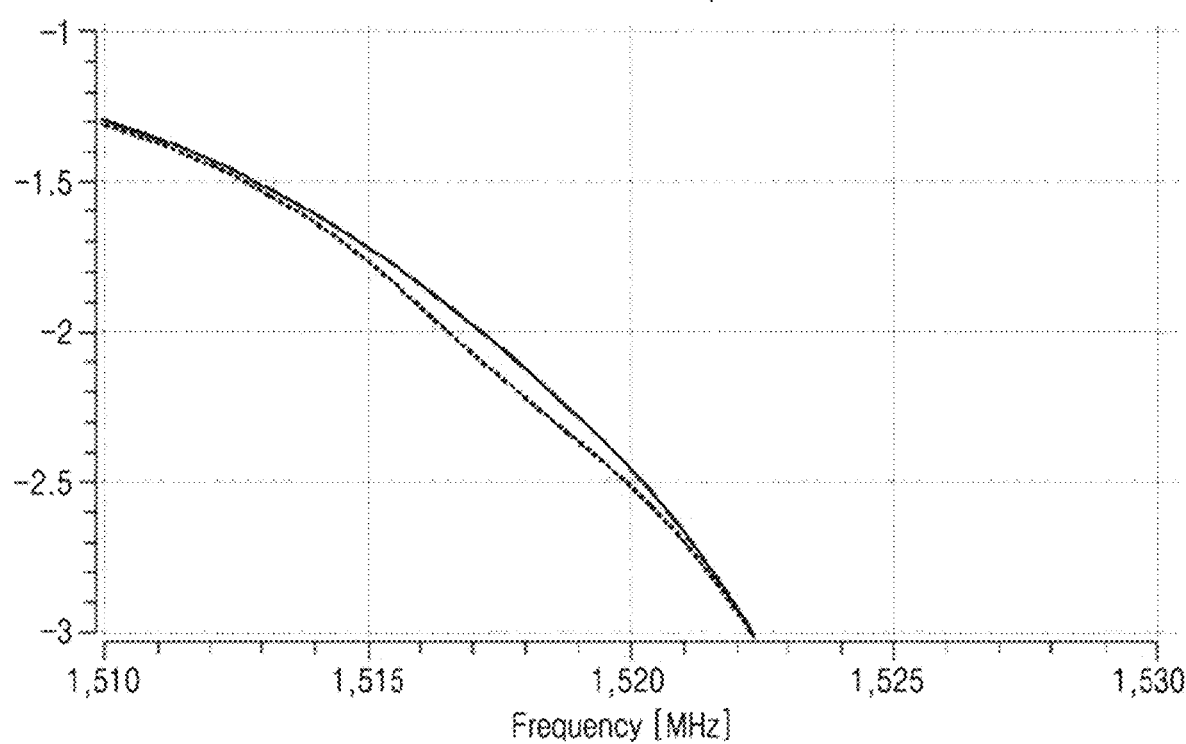
FIG. 8A is a graph showing the comparison between the characteristics of the SAW device having the parallel resonator according to a third embodiment of the present invention as mentioned in FIG. 5 and the characteristics of the SAW device having the parallel resonator in the conventional practice.
Figure 8B:
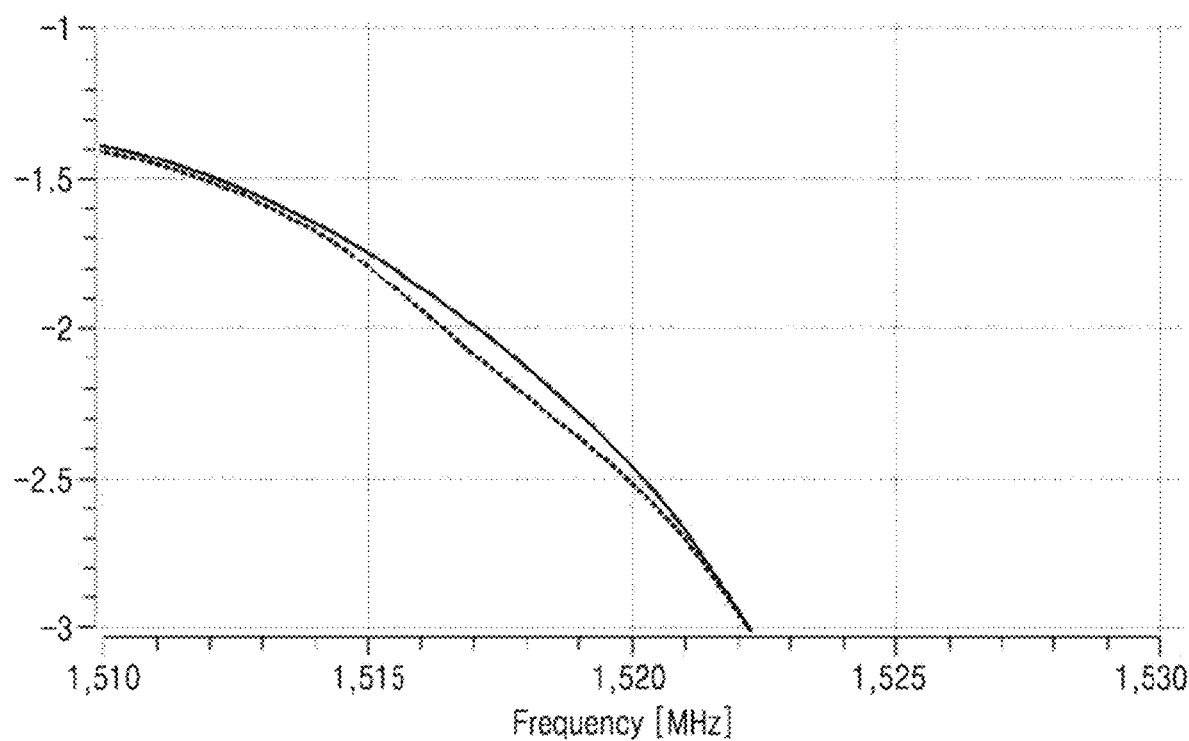
FIG. 8B is a graph showing the comparison between the characteristics of the SAW device having the parallel resonator according to the third embodiment of the present invention as mentioned in FIG. 5 and the characteristics (after mismatch losses are reduced) of the SAW device having the parallel resonator in the conventional practice.

FIG. 8A is a graph showing the comparison between the characteristics of the SAW device having the parallel resonator according to the third embodiment of the present invention as mentioned in FIG. 5 and the characteristics of the SAW device having the parallel resonator in the conventional practice. FIG. 8B is a graph showing the comparison between the characteristics of the SAW device having the parallel resonator according to the third embodiment of the present invention as mentioned in FIG. 5 and the characteristics (after mismatch losses are reduced) of the SAW device having the parallel resonator in the conventional practice.

Figure 9A:
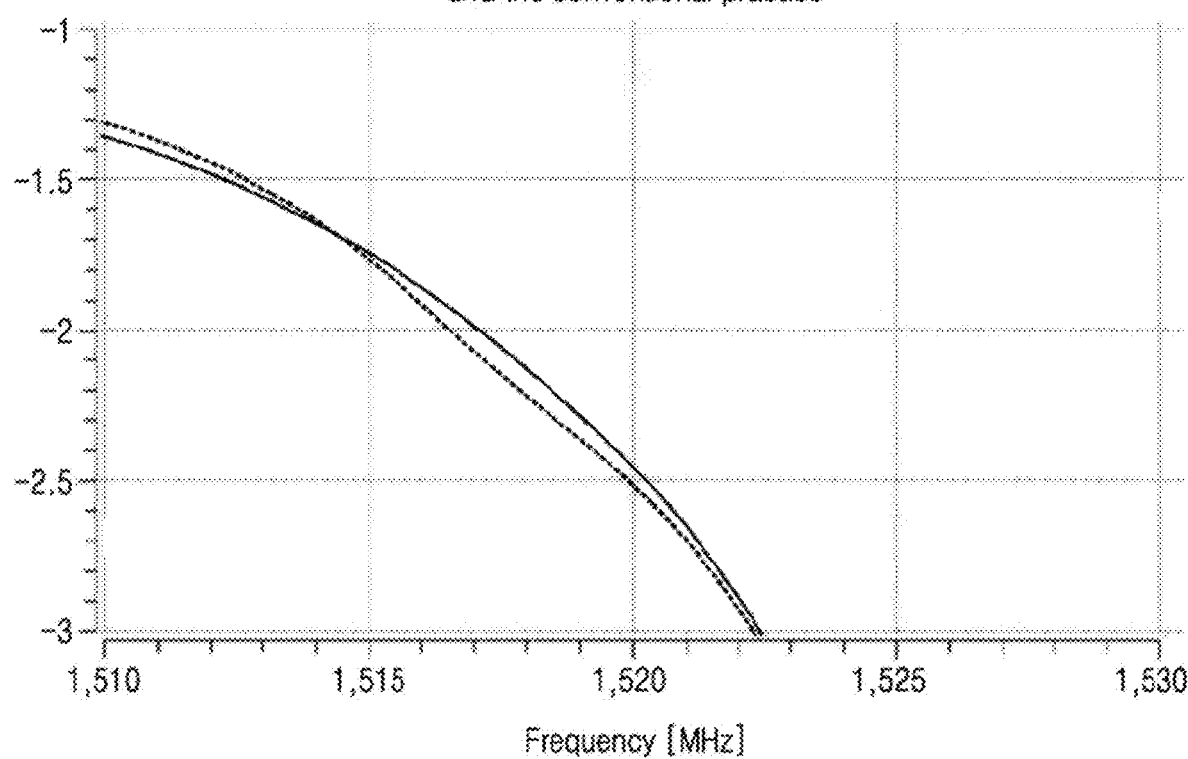
FIG. 9A is a graph showing the comparison between the characteristics of the SAW device having the parallel resonator according to a fourth embodiment of the present invention as mentioned in FIG. 5 and the characteristics of the SAW device having the parallel resonator in the conventional practice.
Figure 9B:
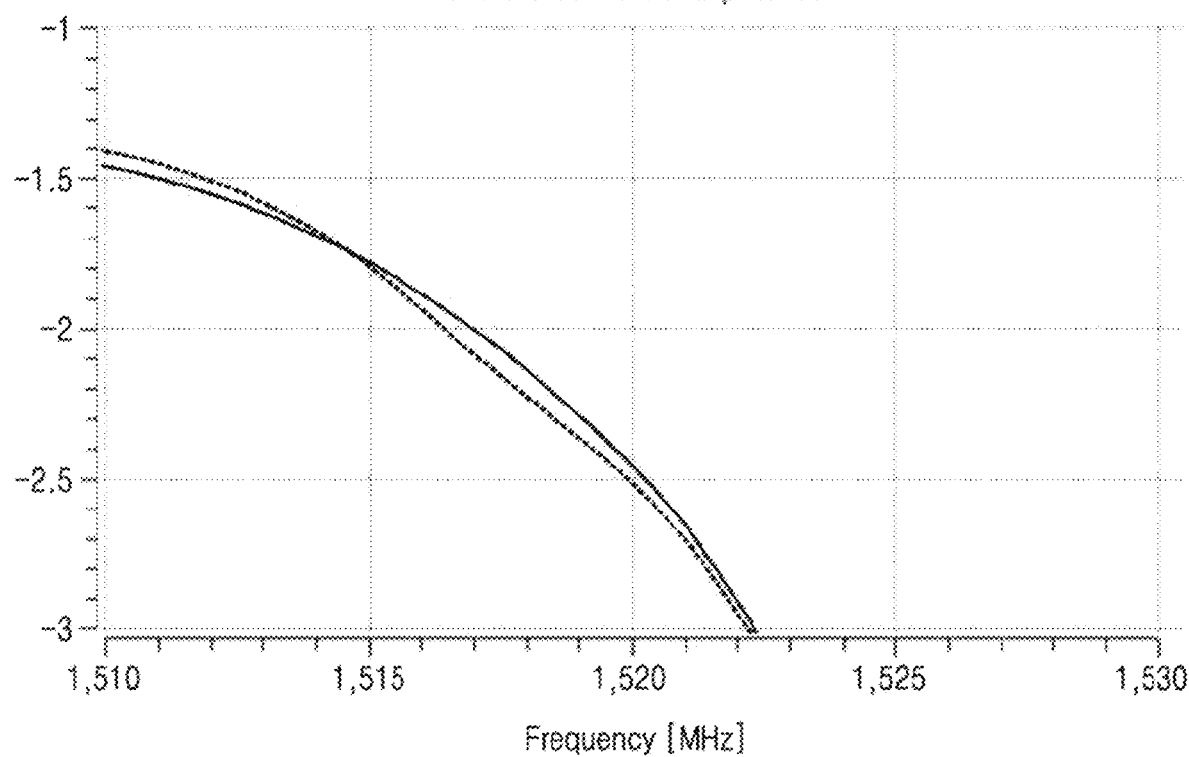
FIG. 9B is a graph showing the comparison between the characteristics of the SAW device having the parallel resonator according to the fourth embodiment of the present invention as mentioned in FIG. 5 and the characteristics (after mismatch losses are reduced) of the SAW device having the parallel resonator in the conventional practice.

FIG. 9A is a graph showing the comparison between the characteristics of the SAW device having the parallel resonator according to the fourth embodiment of the present invention as mentioned in FIG. 5 and the characteristics of the SAW device having the parallel resonator in the conventional practice. FIG. 9B is a graph showing the compari-son between the characteristics of the SAW device having the parallel resonator according to the fourth embodiment of the present invention as mentioned in FIG. 5 and the characteristics (after mismatch losses are reduced) of the SAW device having the parallel resonator in the conventional practice.

Figure 10A:
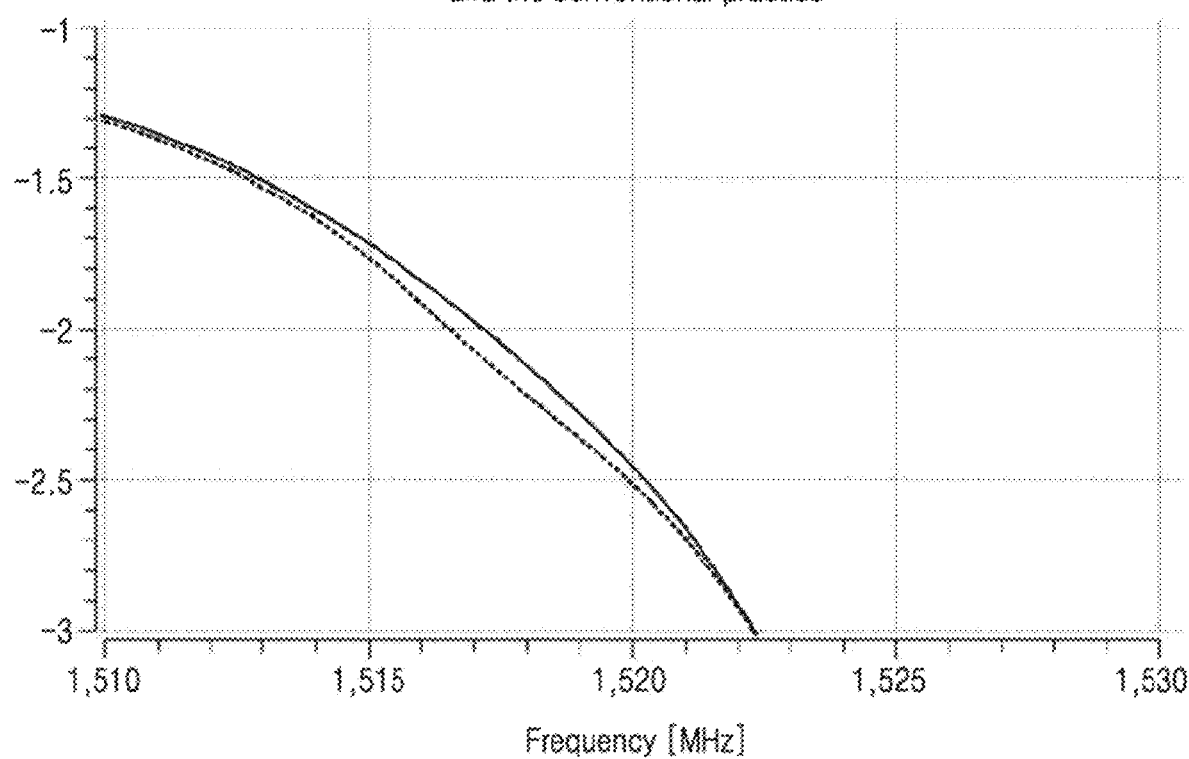
FIG. 10A is a graph showing the comparison between the characteristics of the SAW device having the parallel resonator according to a fifth embodiment of the present invention as mentioned in FIG. 5 and the characteristics of the SAW device having the parallel resonator in the conventional practice.
Figure 10B:
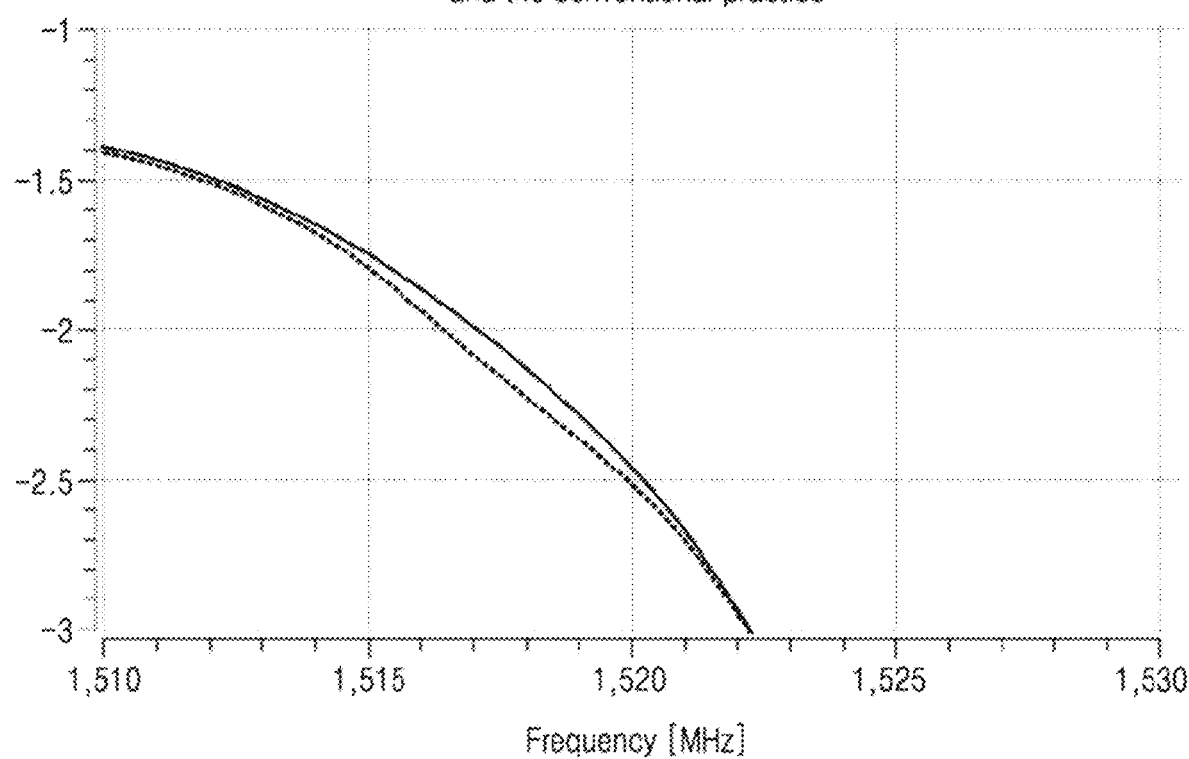
FIG. 10B is a graph showing the comparison between the characteristics of the SAW device having the parallel resonator according to the fifth embodiment of the present invention as mentioned in FIG. 5 and the characteristics (after mismatch losses are reduced) of the SAW device having the parallel resonator in the conventional practice.

FIG. 10A is a graph showing the comparison between the characteristics of the SAW device having the parallel resonator according to the fifth embodiment of the present invention as mentioned in FIG. 5 and the characteristics of the SAW device having the parallel resonator in the conventional practice. FIG. 10B is a graph showing the comparison between the characteristics of the SAW device having the parallel resonator according to the fifth embodiment of the present invention as mentioned in FIG. 5 and the characteristics (after mismatch losses are reduced) of the SAW device having the parallel resonator in the conventional practice.

Figure 11A:
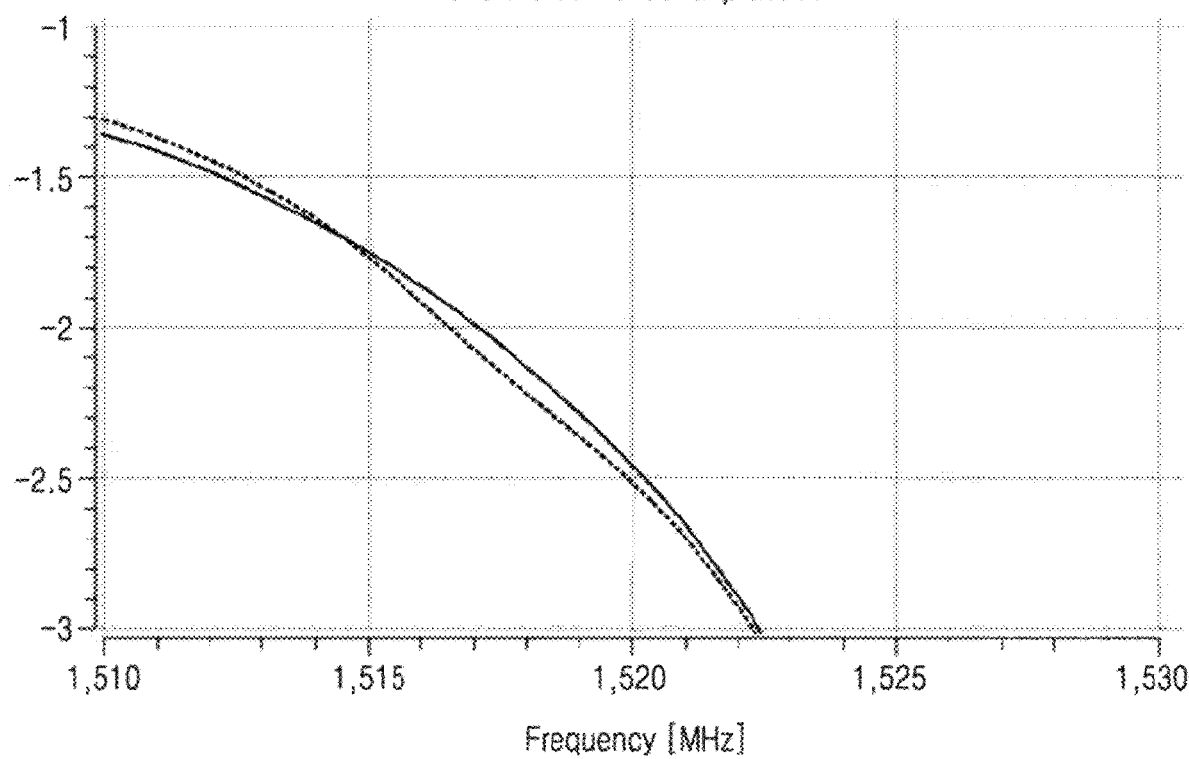
FIG. 11A is a graph showing the comparison between the characteristics of the SAW device having the parallel resonator according to a sixth embodiment of the present invention as mentioned in FIG. 5 and the characteristics of the SAW device having the parallel resonator in the conventional practice.
Figure 11B:
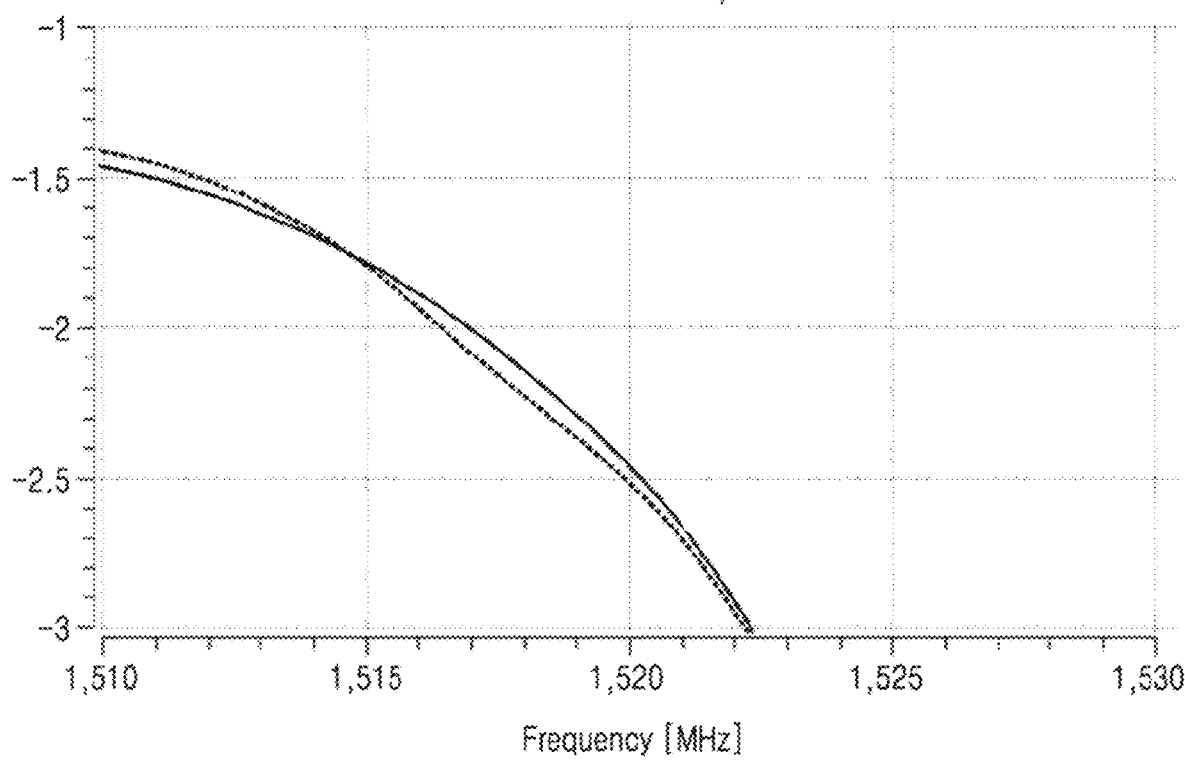
FIG. 11B is a graph showing the comparison between the characteristics of the SAW device having the parallel resonator according to the sixth embodiment of the present invention as mentioned in FIG. 5 and the characteristics (after mismatch losses are reduced) of the SAW device having the parallel resonator in the conventional practice.

FIG. 11A is a graph showing the comparison between the characteristics of the SAW device having the parallel resonator according to the sixth embodiment of the present invention as mentioned in FIG. 5 and the characteristics of the SAW device having the parallel resonator in the conventional practice. FIG. 11B is a graph showing the comparison between the characteristics of the SAW device having the parallel resonator according to the sixth embodiment of the present invention as mentioned in FIG. 5 and the characteristics (after mismatch losses are reduced) of the SAW device having the parallel resonator in the conventional practice.

As shown in FIGS. 6A to 11B, solid lines indicate the characteristics of the SAW devices having the parallel resonators according to the embodiments of the present invention, and dotted lines indicate the characteristics of the SAW device having the parallel resonator in the conventional practice.

As shown, it is understood that insertion losses in high frequency bands of the passbands of the SAW devices having the parallel resonators according to the embodiments of the present invention can be more suppressed than those in a high frequency band of the passband of the SAW device having the parallel resonator in the conventional practice. Degrees of insertion losses improved and the frequency bands may be different in the respective embodiments of the present invention, but in all of the embodiments of the present invention, it can be found that the insertion losses are at least partially suppressed.

3. Extension Examples

In the embodiment of the present invention, as shown in FIG. 3, the length from one end 30a of the IDT 30 to the other end 30b of the IDT 30 along the longitudinal direction D is divided into three equal portions, and accordingly, the IDT 30 has the three areas I, II and III (having almost the same unit lengths as one another). According to the present invention, however, the length from one end 30a of the IDT 30 to the other end 30b of the IDT 30 along the longitudinal direction D may be divided into for example, five (seven or nine) equal portions to allow the IDT 30 to have five (seven or nine) areas. According to the present invention, in detail, it is possible that the length from one end 30a of the IDT 30 to the other end 30b of the IDT 30 along the longitudinal direction D may be divided into an odd number of equal portions to allow the IDT 30 to have an odd number of areas (having almost the same unit lengths as one another).

In this case, the pitches the respective areas have are determined according to the following rules.

Firstly, any one of the respective areas becomes a main electrode area. Among the remaining areas, any two arbitrary areas become one pair of first electrode areas. Among the remaining areas, next, any two arbitrary areas become one pair of second electrode areas. Among the remaining areas, further, any two arbitrary areas become one pair of third electrode areas. Next, the remaining arbitrary area becomes a fourth electrode area. Such processes are repeatedly carried out until the remaining areas disappear.

Secondly, the main electrode area has a reference pitch. The reference pitch d can be determined as $d=\lambda/2$. In this case, the $\lambda$ is a wavelength of the surface acoustic wave transferred from the piezoelectric substrate 10, which is determined according to a material constituting the piezoelectric substrate 10 and an application voltage V.

Thirdly, one side first electrode area of one pair of first electrode areas has a first increment pitch obtained by increasing the reference pitch by a first value (which is appropriately determined). Further, the other side first electrode area of one pair of first electrode areas has a first decrement pitch obtained by decreasing the reference pitch by almost the same value as the first value. In this case, almost the same value as the first value is in a range of 80 to 120% of the first value, desirably 90 to 110% of the first value, and more desirably exactly the same as the first value.

Fourthly, one side second electrode area of one pair of second electrode areas has a second increment pitch obtained by increasing the reference pitch by a second value (which is appropriately determined). Further, the other side second electrode area of one pair of second electrode areas has a second decrement pitch obtained by decreasing the reference pitch by almost the same value as the second value. In this case, almost the same value as the second value is in a range of 80 to 120% of the second value, desirably 90 to 110% of the second value, and more desirably exactly the same as the second value.

Fifthly, one side third electrode area of one pair of third electrode areas has a third increment pitch obtained by increasing the reference pitch by a third value (which is appropriately determined). Further, the other side third electrode area of one pair of third electrode areas has a third decrement pitch obtained by decreasing the reference pitch by almost the same value as the third value. In this case, the third value is a different value from the first value and the second value, which is greater or less than the first value and the second value. In this case, also, almost the same value as the third value is in a range of 80 to 120% of the third value, desirably 90 to 110% of the third value, and more desirably exactly the same as the third value.

Sixthly, one side fourth electrode area of one pair of fourth electrode areas has a fourth increment pitch obtained by increasing the reference pitch by a fourth value (which is appropriately determined). Further, the other side fourth electrode area of one pair of fourth electrode areas has a fourth decrement pitch obtained by decreasing the reference pitch by almost the same value as the fourth value. In this case, the fourth value is a different value from the first to third values, which is greater or less than the first to third values. In this case, also, almost the same value as the fourth value is in a range of 80 to 120% of the third value, desirably 90 to 110% of the fourth value, and more desirably exactly the same as the fourth value.

Lastly, even in case where one pair of fifth electrode areas exists, the pitches one pair of fifth electrode areas has can be determined like one pairs of second to fourth electrode areas as mentioned above.

In the extension examples, for example, if the IDT 30 has five areas I to V, methods for determining the pitches of the IDT 30 will be explained below.

Figure 12:
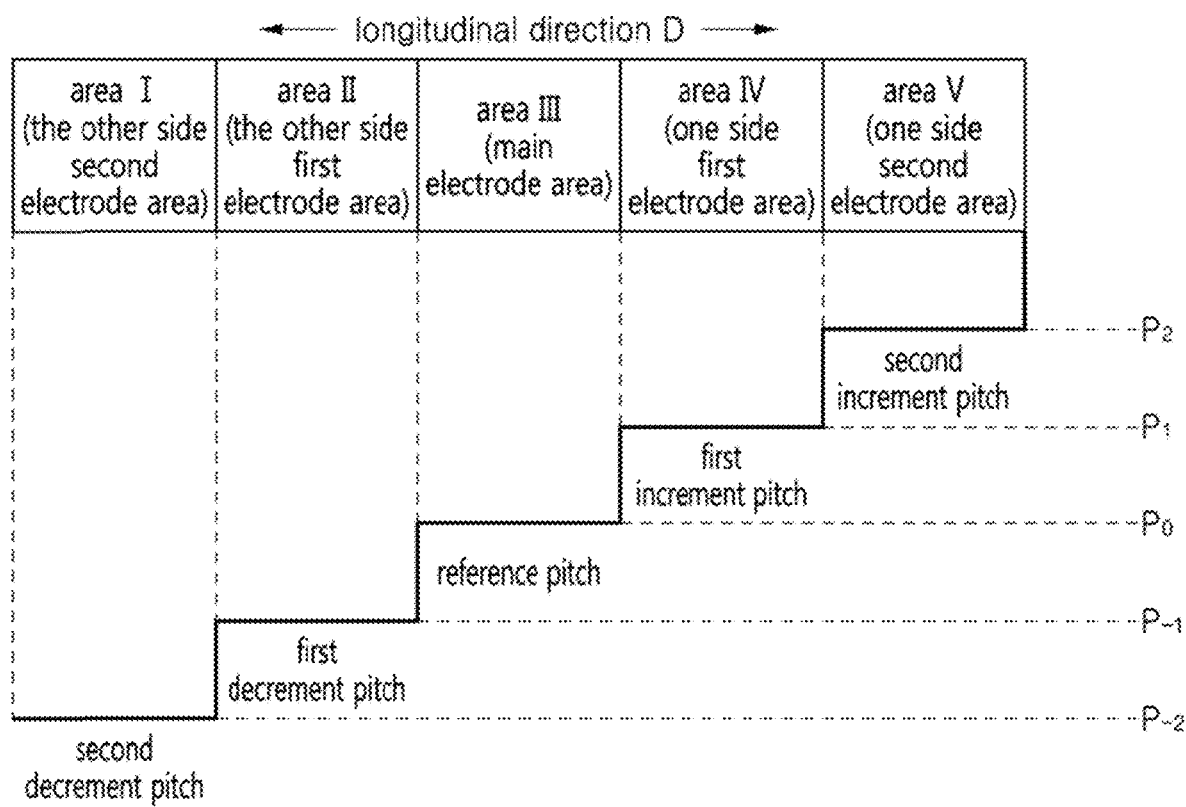
FIG. 12 is a diagram showing examples of pitches applicable to the parallel resonator used in the SAW device of FIG. 2.
Figure 13:
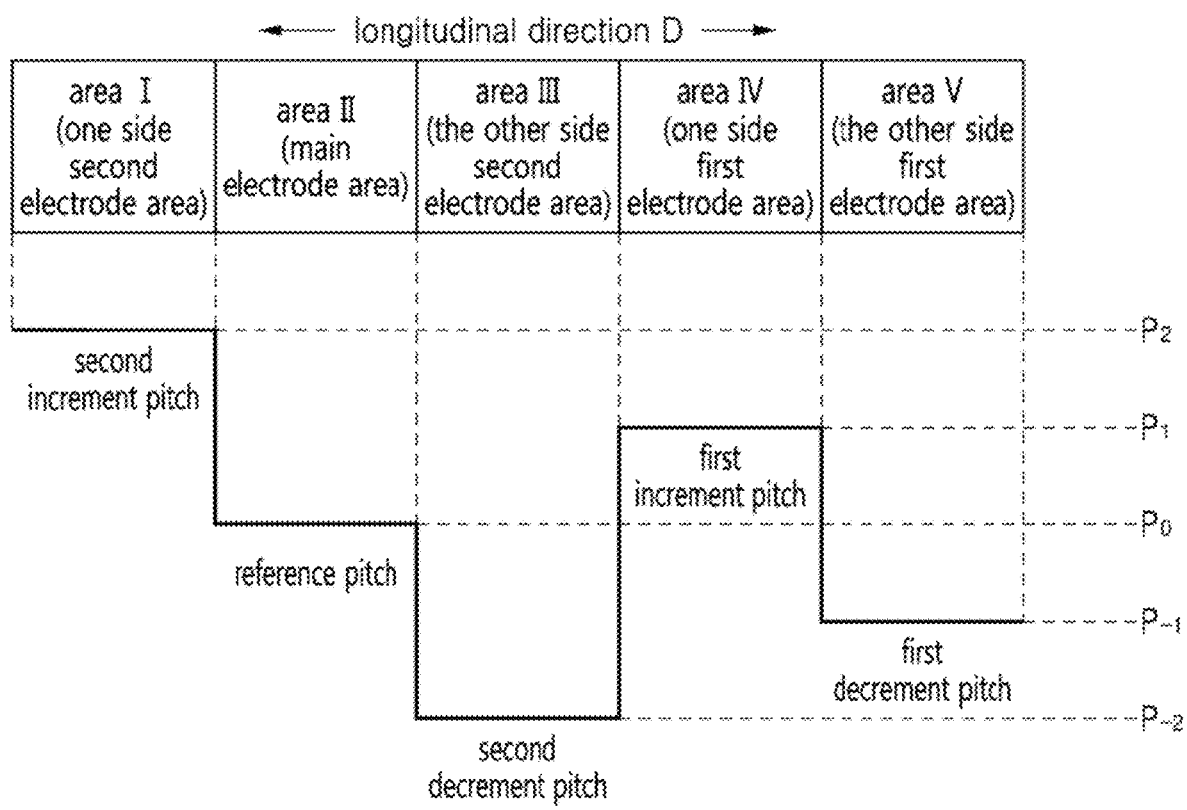
FIG. 13 is a diagram showing other examples of pitches applicable to the parallel resonator used in the SAW device of FIG. 2.

FIG. 12 is a diagram showing examples of pitches applicable to the parallel resonator used in the SAW device 1 of FIG. 2. FIG. 13 is a diagram showing other examples of pitches applicable to the parallel resonator used in the SAW device 1 of FIG. 2.

As shown in FIGS. 12 and 13, a length from one end 30a of the IDT 30 to the other end 30b of the IDT 30 along the longitudinal direction D is divided into five equal portions to allow the IDT 30 to have five areas I, II, III, IV, and V.

Referring first to FIG. 12, the area III becomes the main electrode area having the reference pitch, the area IV one side first electrode area having the first increment pitch, the area II the other side first electrode area having the first decrement pitch, the area V one side second electrode area having the second increment pitch, and the area I the other side second electrode area having the second decrement pitch.

The first increment pitch $P_1$ is obtained by increasing the reference pitch $P_0$ by the first value. The first decrement pitch $P_{-1}$ is obtained by decreasing the reference pitch $P_0$ by the first value. Also, the second increment pitch $P_2$ is obtained by increasing the reference pitch $P_0$ by the second value. The second decrement pitch $P_{-2}$ is obtained by decreasing the reference pitch $P_0$ by the second value.

Referring now to FIG. 13, the area II becomes the main electrode area having the reference pitch, the area IV one side first electrode area having the first increment pitch, the area V the other side first electrode area having the first decrement pitch, the area I one side second electrode area having the second increment pitch, and the area III the other side second electrode area having the second decrement pitch.

In the same manner as shown in FIG. 12, the pitches can be determined. In detail, the first increment pitch $P_1$ is obtained by increasing the reference pitch $P_0$ by the first value. The first decrement pitch $P_{-1}$ is obtained by decreasing the reference pitch $P_0$ by the first value. Also, the second increment pitch $P_2$ is obtained by increasing the reference pitch $P_0$ by the second value. The second decrement pitch $P_{-2}$ is obtained by decreasing the reference pitch $P_0$ by the second value.

4. Embodiments of the Piezoelectric Substrate 10 and the Parallel Resonator 20

In the embodiments of the present invention, the piezoelectric substrate 10 and the parallel resonator 20 are used with configurations as will be mentioned below. The configurations are just examples, and therefore, they may be appropriated changeable if necessary.

(1) Piezoelectric substrate 10
Substrate material: LiTaO$_3$
Cut angle: 42°
(2) Parallel resonator 20
Material of IDT: AlCu
Thickness of IDT: 275 nm
Reference Pitch: 1.385 u m
First value: 0.013 u m (first increment pitch or first decrement pitch are obtained by increasing and decreasing the reference pitch by the first value)
Pitch of reflector: 1.385 u m
Aperture $\lambda$: 17
Numbers of finger pairs of each IDT: 58.5
Duty of IDT and reflector: 0.52

As described above, the resonator (SAW resonator) according to the present invention is capable of being improved in performance and reducing insertion losses in the characteristics of the SAW device (for example, filter, duplexer, etc.) using the resonator.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A resonator comprising an interdigital transducer provided with a main electrode area formed to a shape of a comb on a piezoelectric substrate by means of a reference pitch in such a manner as to have a unit length along a longitudinal direction thereof and one pair of first electrode areas constituted of one side first electrode area formed to a shape of a comb on the piezoelectric substrate by means of a first increment pitch obtained by increasing the reference pitch by a first value in such a manner as to have the unit length along the longitudinal direction and the other side first electrode area formed to a shape of a comb on the piezoelectric substrate by means of a first decrement pitch obtained by decreasing the reference pitch by almost the same value as the first value.

2. The resonator according to claim 1, wherein the main electrode area is located between one side first electrode area and the other side first electrode area.

3. The resonator according to claim 1, wherein one side first electrode area is located between the main electrode area and the other side first electrode area.

4. The resonator according to claim 1, wherein the other side first electrode area is located between the main electrode area and one side first electrode area.

5. The resonator according to claim 1, wherein the unit lengths are obtained by dividing a length from one end of the interdigital transducer to the other end thereof in the longitudinal direction into three equal portions.

6. The resonator according to claim 1, wherein the interdigital transducer further comprises one pair of second electrode areas constituted of one side second electrode area formed to a shape of a comb on the piezoelectric substrate by means of a second increment pitch obtained by increasing the reference pitch by a second value different from the first value in such a manner as to have the unit length along the longitudinal direction and the other side second electrode area formed to a shape of a comb on the piezoelectric substrate by means of a second decrement pitch obtained by decreasing the reference pitch by almost the same value as the second value.

7. The resonator according to claim 6, wherein the unit lengths are obtained by dividing a length from one end of the interdigital transducer to the other end thereof in the longitudinal direction into five equal portions.

8. The resonator according to claim 6, wherein the interdigital transducer further comprises one pair of third electrode areas constituted of one side third electrode area formed to a shape of a comb on the piezoelectric substrate by means of a third increment pitch obtained by increasing the reference pitch by a third value different from the first value and the second value in such a manner as to have the unit length along the longitudinal direction and the other side third electrode area formed to a shape of a comb on the piezoelectric substrate by means of a third decrement pitch obtained by decreasing the reference pitch by almost the same value as the third value.

9. The resonator according to claim 8, wherein the unit lengths are obtained by dividing a length from one end of the interdigital transducer to the other end thereof in the longitudinal direction into seven equal portions.

10. The resonator according to claim 8, wherein the interdigital transducer further comprises one pair of fourth electrode areas constituted of one side fourth electrode area formed to a shape of a comb on the piezoelectric substrate by means of a fourth increment pitch obtained by increasing the reference pitch by a fourth value different from the first value, the second value and the third value in such a manner as to have the unit length along the longitudinal direction and the other side fourth electrode area formed to a shape of a comb on the piezoelectric substrate by means of a fourth decrement pitch obtained by decreasing the reference pitch by almost the same value as the fourth value.

11. The resonator according to claim 10, wherein the unit lengths are obtained by dividing a length from one end of the interdigital transducer to the other end thereof in the longitudinal direction into nine equal portions.

12. The resonator according to claim 10, wherein almost the same value as the first value is in a range of 80 to 120% of the first value, almost the same value as the second value is in a range of 80 to 120% of the second value, almost the same value as the third value is in a range of 80 to 120% of the third value, and almost the same value as the fourth value is in a range of 80 to 120% of the fourth value.

13. The resonator according to claim 12, wherein almost the same value as the first value is in a range of 90 to 110% of the first value, almost the same value as the second value is in a range of 90 to 110% of the second value, almost the same value as the third value is in a range of 90 to 110% of the third value, and almost the same value as the fourth value is in a range of 90 to 110% of the fourth value.

* * * * *